(12) United States Patent
Yoshida

(10) Patent No.: US 7,687,296 B2
(45) Date of Patent: Mar. 30, 2010

(54) SEMICONDUCTOR DEVICE FABRICATION METHOD

(75) Inventor: Masashi Yoshida, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 280 days.

(21) Appl. No.: 11/513,130

(22) Filed: Aug. 31, 2006

(65) Prior Publication Data
US 2007/0072134 A1    Mar. 29, 2007

(30) Foreign Application Priority Data
Sep. 29, 2005    (JP) .............................. 2005-284286

(51) Int. Cl.
*H01L 21/00* (2006.01)
(52) U.S. Cl. ............................ 438/48; 438/50; 438/106; 438/118; 438/120; 257/678; 257/687; 257/E21.499
(58) Field of Classification Search ............... 438/52, 438/106, 120, 48, 50, 118; 257/678, 687, 257/E33.056, E21.499
See application file for complete search history.

(56) References Cited
U.S. PATENT DOCUMENTS
5,368,634 A * 11/1994 Hackett ....................... 95/260

6,082,373 A * 7/2000 Sakurai et al. ................. 134/1

FOREIGN PATENT DOCUMENTS
JP    2005-284286    9/2005

OTHER PUBLICATIONS

Hsiao et al., "Evaporation-Assisted Formation of Three-Dimensional Photonic Crystals", Apr. 2005, J. Am. Ceram. Soc. vol. 88 No. 4, pp. 974-976.*
Straub et al., "Optimization of low-temperature silicon epitaxy on seeded glass substrates by ion-assisted deposition", Apr. 2005, J. of Crys. Growth vol. 280, pp. 385-400.*

* cited by examiner

*Primary Examiner*—Alexander G Ghyka
*Assistant Examiner*—Leonard Chang
(74) *Attorney, Agent, or Firm*—Rabin & Berdo, PC

(57) ABSTRACT

Circuit elements, such as aluminum interconnects, and a protective film for protecting these circuit elements are formed on a surface of a semiconductor substrate. Resist is formed covering the protective film. The semiconductor substrate on which the resist covering the protective film is formed is dipped into pure water so as to allow the water to filter into a gap between the resist and semiconductor substrate. Then the semiconductor substrate having the resist thereon is dried in high temperature air, and the resist is adhered to the semiconductor substrate by a sticking function due to the surface tension generated when the water is decreasing. The semiconductor substrate to which the resist is adhered is cleaned by a hydrogen fluoride aqueous solution.

16 Claims, 4 Drawing Sheets

HF AQUEOUS SOLUTION

SEMICONDUCTOR DEVICE FABRICATION METHOD

BACKGROUND OF THE INVENTION

1. Field of the Invention

The present invention relates to a semiconductor device fabrication method, and more particularly to an HF (hydrogen fluoride) cleaning technology used in the fabrication method.

2. Description of the Related Art

FIG. 1A and FIG. 1B of the accompanying drawings depict an acceleration sensor 20 which is formed by processing a silicon substrate. FIG. 1A is a perspective view and FIG. 1B is a partial cross-sectional view taken along the 1B-1B line in FIG. 1A.

This acceleration sensor 20 has an outer frame section 1a, a weight section 1b and beam sections 1c. These sections are integrated by processing a silicon substrate 1. The outer frame section 1a supports the weight section 1b formed at the center via the flexible four beams 1c.

On the surface of each beam section 1c, an insulation film 2 made of $SiO_2$ is formed, and piezo resistors 3 are provided on the insulation film 2. The resistance values of the piezo resistors 3 are changed according to the deflection of the beam sections 1c when displacement of the weight section 1b is caused by an acceleration. The piezo resistors 3 are connected to the pads 5 provided on the surface of the outer frame 1a by aluminum wires 4. The pads 5 are provided for connection to external devices.

The surfaces of the insulation film 2, piezo resistors 3 and aluminum wires 4 are protected by a protective film 6. The pads 5 are not protected (covered) by the protective film 6.

The acceleration sensors are fabricated by forming an insulation film 2, piezo resistors 3, aluminum wires 4 and pad 5 for each of many acceleration sensors on the silicon substrate 1, covering each insulation film 2 and other areas by a protective film 6, and removing the silicon between the outer frame section 1a and weight section 1b by etching for each acceleration sensor, so as to from a space between the outer frame section 1a and weight section 1b. The substrate is cut into individual sensors to have the acceleration sensor shown in FIG. 1A.

After forming the space section by etching, cleaning is performed to remove foreign substance attached to the surface of the outer frame section 1a and weight section 1b. This cleaning is performed using HF aqueous solution to remove $SiO_2$ residue. In order to protect the insulation film 2, piezo resistors 3, aluminum wires 4 and pads 5 formed on the silicon substrate 1 from the HF aqueous solution (cleaning solution), the silicon substrate is covered with resist 11, as shown in FIG. 1B, and then the silicon substrate having the resist 11 thereon is dipped into the HF aqueous solution for cleaning.

This acceleration sensor is disclosed in Japanese Patent Application Laid-Open (Kokai) No. 2003-139791.

If the cleaning is carried out with the HF aqueous solution, the following problem arises. Because of insufficient adhesion between the silicon substrate 1 and resist 11, HF aqueous solution enters (filters into) the gap between the silicon substrate 1 and the resist 11, etches the insulation film 2, and corrodes the aluminum wires 4. As a result, the HF aqueous solution deteriorates qualities of the product.

SUMMARY OF THE INVENTION

It is an object of the present invention to prevent HF aqueous solution from filtering into the gap between the silicon substrate and the resist during cleaning.

According to one aspect of the present invention, there is provided a semiconductor device fabrication method that includes the step of preparing a semiconductor substrate on which one or more circuit elements and a protective film for protecting the circuit element(s) are formed, and the step of forming a resist that covers the protective film. The fabrication method also includes a pure water dipping step for dipping the semiconductor substrate, on which the resist covering the protective film is formed, into pure water so as to allow water to filter into a gap between the resist and semiconductor substrate. The fabrication method also includes a drying step for adhering the resist to the semiconductor substrate by drying the semiconductor substrate having the resist thereon at high temperature so as to evaporate the water that has filtered into the gap between the resist and semiconductor substrate.

In the pure water dipping step, water is forced to filter into the gap between the resist and semiconductor substrate. Then, this water is evaporated at high temperature by the drying step. Strong surface tension is generated when water is decreased by evaporation during the drying step. In other words, a sticking function for the resist to adhere to the semiconductor substrate is generated. Because of the sticking function, the hydrogen fluoride aqueous solution is prevented from filtering into the gap between the semiconductor substrate and resist during a cleaning step. Therefore, corrosion of the circuit elements can be prevented.

Between the pure water dipping step and drying step, a surface active agent dipping step may be carried out for dipping the semiconductor device into a bath of a surface active agent, so as to substitute the water, which is filtered in the gap between the semiconductor substrate and the resist, with the surface active agent. A second pure water dipping step may be carried out after the surface active agent dipping step for substituting the surface active agent with the pure water. By performing the surface active agent dipping step in this way, airing, which would be generated in the first pure water dipping step, can be removed.

Between the surface active agent dipping step and the second pure water dipping step, an etchant dipping step may be performed for dipping the semiconductor device into a bath of hydrogen fluoride aqueous solution, so as to remove a natural oxide film from the surface of the silicon substrate. The second pure water dipping step removes the hydrogen fluoride aqueous solution filtered into the gap between the semiconductor substrate and the resist, and substitutes the hydrogen fluoride aqueous solution with the pure water. By performing the etchant dipping step, the semiconductor substrate has bumps (concave and convex) in its surface. The resist are more strongly adhered to the semiconductor substrate during the subsequent drying step because of the bumps formed on the semiconductor substrate surface.

The above mentioned and other objects, aspects and advantages of the present invention will be more completely understood by reading the following detailed description and appended claims when read in conjunction with the accompanying drawings. The drawings are, however, merely for description, and do not limit the scope of the present invention.

BRIEF DESCRIPTION OF THE DRAWINGS

FIG. 2A to FIG. 2C are cross-sectional views. FIG. 2D is an enlarged view of a portion A in FIG. 2B. FIG. 2E to FIG. 2G are similar enlarged views.

FIG. 3A to FIG. 3C are cross-sectional views. FIG. 3D is an enlarged view of a circled portion in FIG. 3A. FIG. 3E and FIG. 3F are similar enlarged views.

FIG. 4A is a cross-sectional view. FIG. 4B is an enlarged view of a circled portion in FIG. 4A. FIG. 4C to FIG. 4F are similar enlarged views.

DETAILED DESCRIPTION OF THE INVENTION

Embodiment 1

Referring to FIG. 2A to FIG. 2G, a semiconductor device fabrication method according to Embodiment 1 of the present invention will be described. In this embodiment, the semiconductor device is the acceleration sensor, and the semiconductor device fabrication method will be described using the acceleration sensor shown in FIG. 1A and FIG. 1B.

(1) Step 1 (Resist Forming Processing)

Figure 1A:
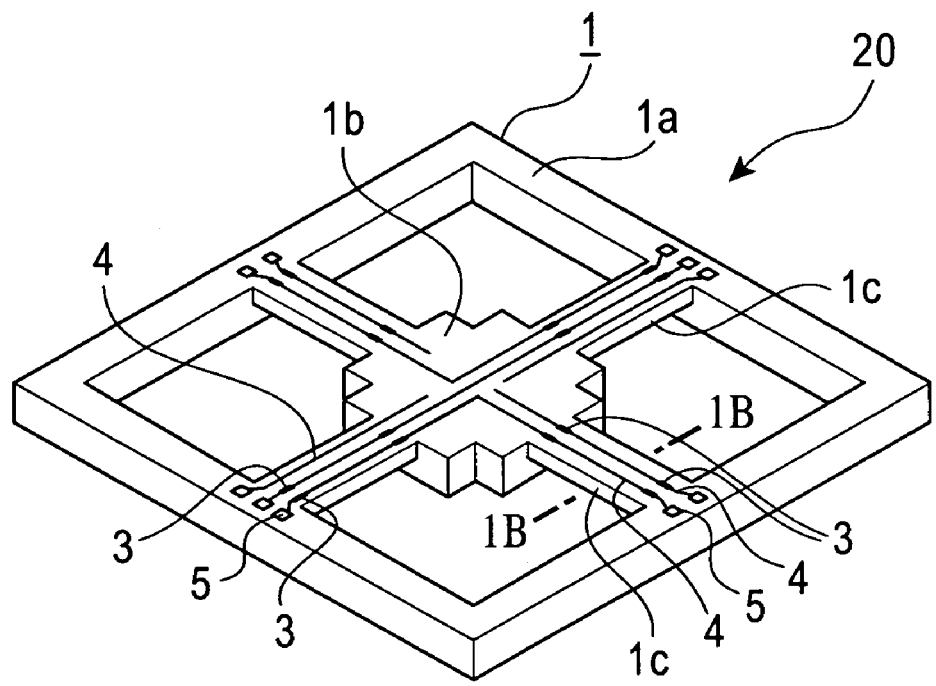
FIG. 1A depicts a perspective view of an acceleration sensor formed by processing a silicon substrate.
Figure 1B:
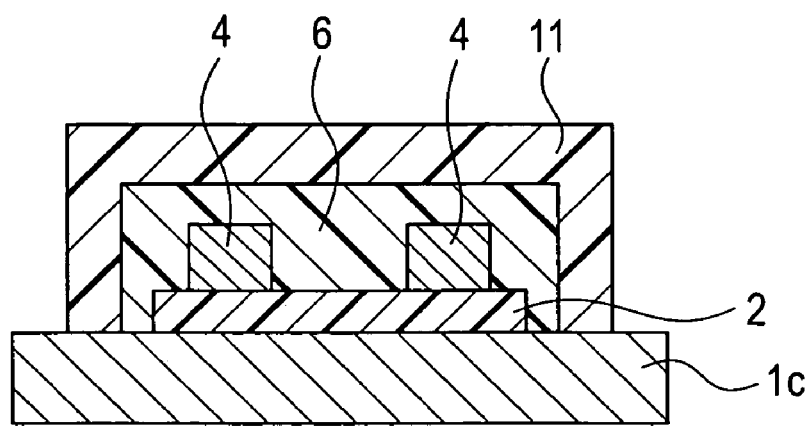
FIG. 1B is a cross-sectional view taken along the line 1B-1B in FIG. 1A.
Figure 2A:
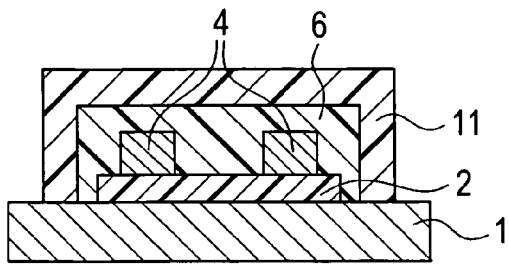
FIG. 2A to FIG. 2G are diagrams of a semiconductor device fabrication method according to Embodiment 1 of the present invention.

As FIG. 2A and FIG. 1A show, the piezo resistors 3 and aluminum interconnects 4 are formed on the insulation film 2 made of $SiO_2$. The insulation film 2 is formed on the surface of the silicon substrate (beam sections) 1. The insulation film 2 and aluminum interconnects 4 are covered by protective film 6 for protecting them from corrosion. Then the silicon between the outer frame section 1a and weight section 1b is removed by etching leaving the beam sections 1c, so as to create a space where the weight section 1b can displace according to acceleration. In order to perform cleaning to remove foreign substances attached to the surface of the outer frame section 1a and weight section 1b, the surface of the protective film 6 is covered with resist 11 to protect the protective film from the HF aqueous solution (cleaning liquid). The resist 11 is thermo-setting resist, for example.

To form the resist 11, photosensitive resist material is coated on the entire surface of the silicon substrate 1 for about 2 μm (thickness), and this is patterned to a predetermined pattern using an ordinary photolithography technology.

(2) Step 2 (Pure Water Dipping Processing)

Figure 2B:
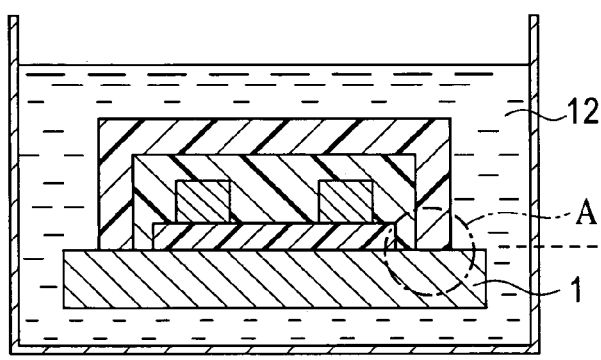
Figure 2D:
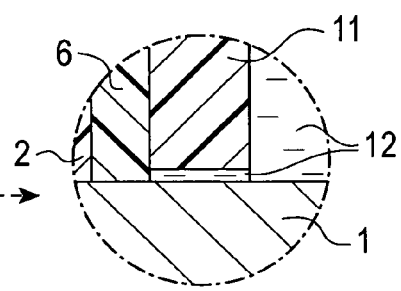

As FIG. 2B shows, the silicon substrate 1 which has the protective film 6 covered with the resist 11 is dipped into the pure water 12. By this dipping, as shown in FIG. 2D (i.e., the enlarged view of the area A in FIG. 2B), water is filtered into the gap between the silicon substrate 1 and resist 11. In this particular embodiment, the water 12 is still in the water tank.

(3) Step 3 (Drying Processing)

Figure 2C:
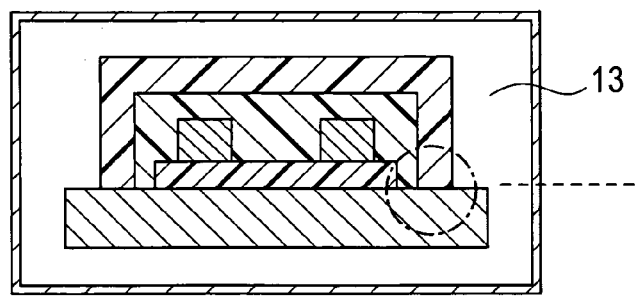
Figure 2E:
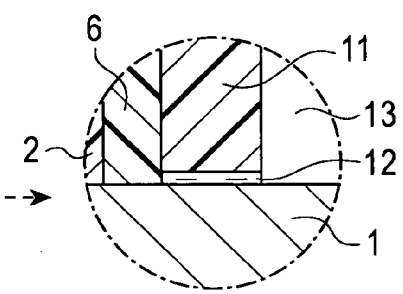
Figure 2G:
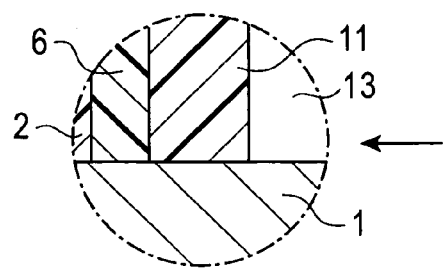
Figure 2F:
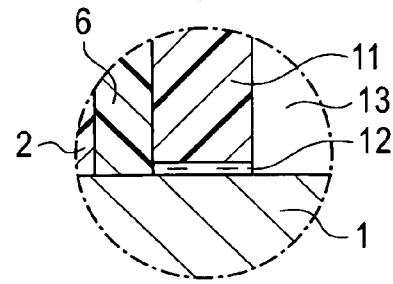

The silicon substrate 1 that contains the water 12 in the gap between the resist 11 and substrate 1 is lifted out from the pure water tank 12, and is placed into a high temperature chamber, as shown in FIG. 2C, so as to perform drying processing in the high temperature (130 to 150° C.) air 13. By this drying processing, the water 12 filtered into the gap between the silicon substrate 1 and resist 11 gradually evaporates.

When the water 12 decreases by evaporation, a sticking function is generated. In other words, the resist 11 is attracted by (pulled toward) the silicon substrate 1 because of the surface tension. By this sticking function, as the enlarged views (FIG. 2E to FIG. 2G) show, the distance between the silicon substrate 1 and resist 11 decreases as the water 12 decreases, and finally the resist 11 firmly adheres to the silicon substrate 1.

(4) Step 4 (HF Cleaning Processing)

Then the entire silicon substrate 1, which has the resist 11 to protect the circuit area, is cleaned using the HF aqueous solution of which concentration is about 5%, so as to remove contaminants and residual $SiO_2$ attached on the surface. The contacting faces of the silicon substrate 1 and resist 11 are adhered to each other by the sticking function generated by the drying processing, so that the entry of HF aqueous solution is prevented.

In this way, according to the semiconductor fabrication method in Embodiment 1, the semiconductor device of which circuit area is protected by the resist 11 is dipped into the pure water 12, allowing water to filter into the gap between the semiconductor substrate 1 and resist 11, and the water is evaporated by the drying processing, so that the resist 11 is adhered to the semiconductor substrate 1 by the sticking function. Therefore even if the semiconductor device is dipped into the HF aqueous solution (cleaning liquid), the HF aqueous solution does not filter into the inside of the semiconductor device through the gap between the resist 11 and semiconductor substrate 1. Consequently, corrosion of the aluminum wires 4 and other elements inside the semiconductor device can be prevented.

Embodiment 2

FIG. 3A to FIG. 3F are diagrams of the semiconductor device fabrication method according to Embodiment 2 of the present invention. The second embodiment has Steps 2a and 2b. Step 2a and Step 2b are additional steps executed between Step 2 and Step 3 of Embodiment 1. Alternatively, it can be said that Step 2 of Embodiment 1 is performed by three steps: the first pure water dipping processing (Step 2), surface active agent dipping processing (Step 2a) and the second pure water dipping processing (Step 2b).

The following description deals with only the differences between the first embodiment and second embodiment to avoid redundant explanation.

Figure 3A:
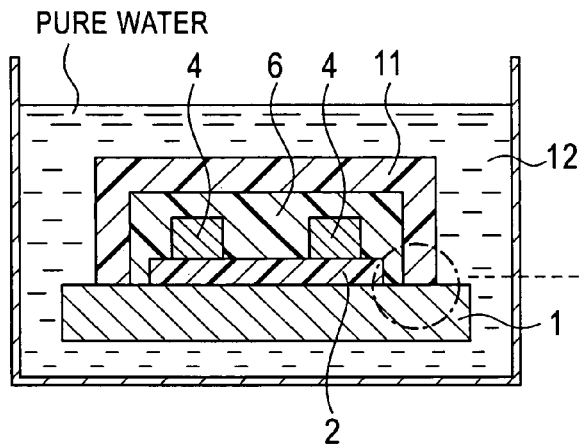
FIG. 3A to FIG. 3F are diagrams of the semiconductor device fabrication method according to Embodiment 2 of the present invention.
Figure 3D:
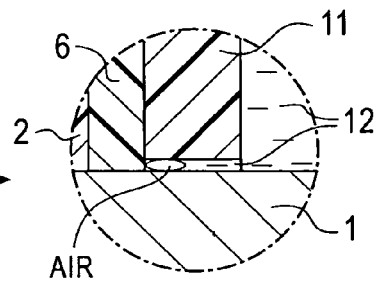

When Step 2 (pure water dipping process) of Embodiment 1 is performed, that is, when the semiconductor device of which circuit area (e.g., protective film 6) on the substrate 1 is covered with the resist 11 is dipped into the pure water 12 as shown in FIG. 3A, the pure water 12 may not filter into the gap between the silicon substrate 1 and resist 11 evenly or sufficiently, and air bubbles may remain in the gap as shown in FIG. 3D. Trapping of the air bubbles in the gap is so called "airing." If airing occurs, surface tension is not generated in that portion, so that the sticking function becomes insufficient even if drying processing is performed. Steps 2a and 2b are processings to remove airing.

(1) Step 2a (Surface Active Agent Dipping Processing)

Figure 3B:
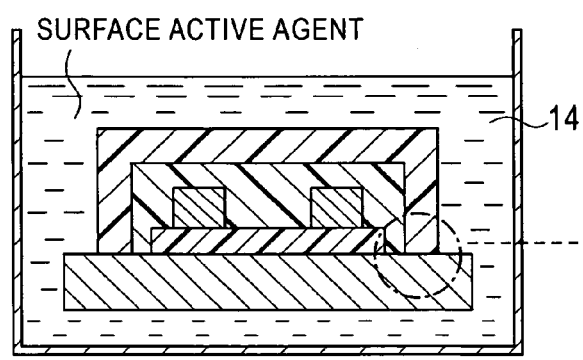
Figure 3E:
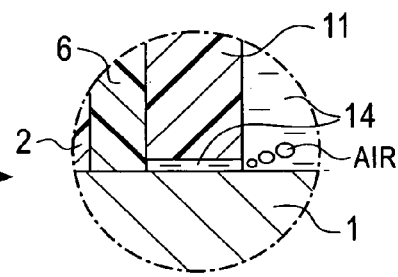

After the first pure water dipping processing in Step 2 of Embodiment 1, the semiconductor device is dipped into a bath filled with the surface active agent 14 as shown in FIG. 3B. As a result, as FIG. 3E shows, the surface active agent 14 filters into the gap between the silicon substrate 1 and resist 11, and air is released while changing the surface status from hydrophobic to hydrophilic. By this air releasing, the air bubbles between the silicon substrate 1 and resist 11 disappear, and the pure water 12 in the gap is substituted with the surface active agent 14.

(2) Step 2b (Pure Water Dipping Processing)

Figure 3C:
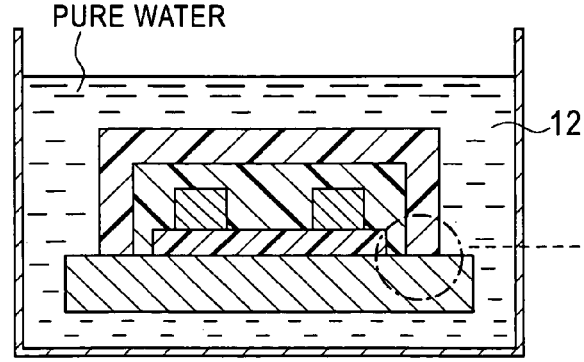
Figure 3F:
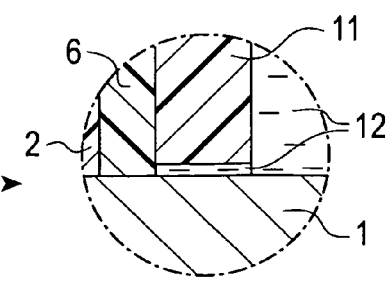

As shown in FIG. 3C, the semiconductor device having the surface active agent 14 filtered into the gap between the substrate 1 and resist 11 is dipped into the pure water 12 again. By this water dipping, as FIG. 3F shows, the surface active agent 14 in the gap between the silicon substrate 1 and resist 11 is substituted with the pure water 12, and the water 12 is evenly filtered into the gap.

The subsequent steps are the same as Steps 3 and 4 in Embodiment 1.

As described above, in the semiconductor device fabrication method in Embodiment 2, the semiconductor device, after the first pure water dipping processing is performed, is dipped into the surface active agent bath, and then the second pure water dipping processing is performed. Therefore, even if airing is generated in the first pure water dipping processing, the air is pushed out by the surface active agent dipping processing, and water 12 can be evenly filtered into the gap in the second pure water dipping processing. Accordingly, the silicon substrate 1 and resist 11 can be adhered to each other more reliably in the subsequent drying processing, and problems in HF cleaning processing can be prevented.

Embodiment 3

FIG. 4A to FIG. 4F are diagrams of the semiconductor device fabrication method according to Embodiment 3 of the present invention. The third embodiment has an etchant dipping processing Step 2ax. Step 2ax is a step performed between step 2a and step 2b of Embodiment 2. It can be said that step 2 of Embodiment 1 is performed by four steps: the first pure water dipping processing (Step 2), surface active agent dipping processing (Step 2a), etchant dipping processing (Step 2ax), and second pure water dipping processing (Step 2b). The following description deals with only the difference between the foregoing embodiments and third embodiment.

Step 2ax (Etchant Dipping Processing)

Figure 4A:
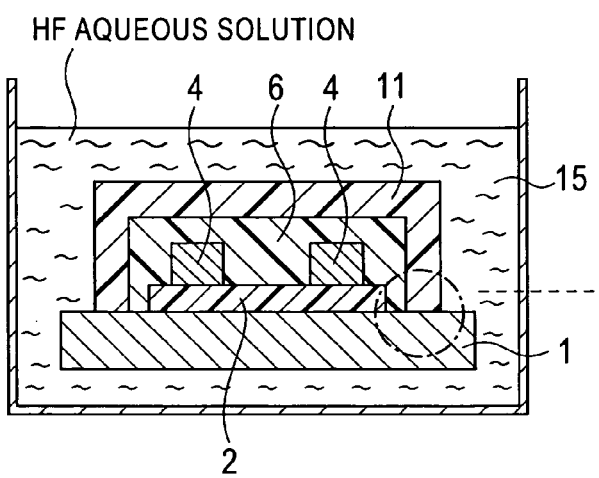
FIG. 4A to FIG. 4F are diagrams of the semiconductor device fabrication method according to Embodiment 3 of the present invention.
Figure 4B:
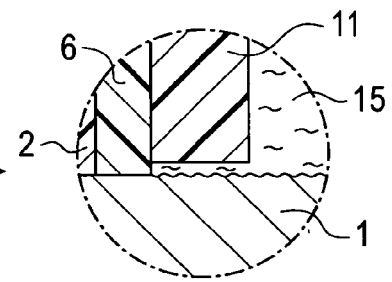

After Step 2a of Embodiment 2, i.e., after the surface active agent 14 is filtered into the gap between the semiconductor substrate 1 and the resist 11, the semiconductor device is dipped in an HF aqueous solution 15, of which concentration is about 5%, for a short time (e.g., 120 seconds or about 2 minutes), so as to remove the natural oxide film ($SiO_2$) on the surface of the silicon substrate 1 in a range that does not reach the protective film 6 as shown in FIG. 4A. By this dipping, the natural oxide film on the surface of the silicon substrate 1 is etched, as FIG. 4B shows, and the surface of the silicon substrate 1 becomes rough with micro bumps.

Figure 4C:
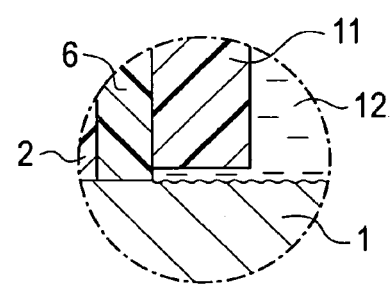
Figure 4D:
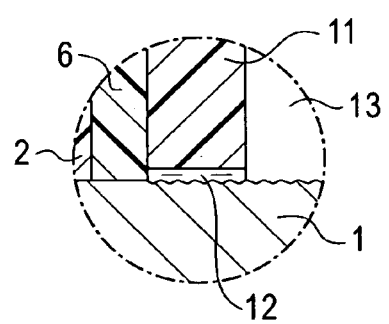
Figure 4E:
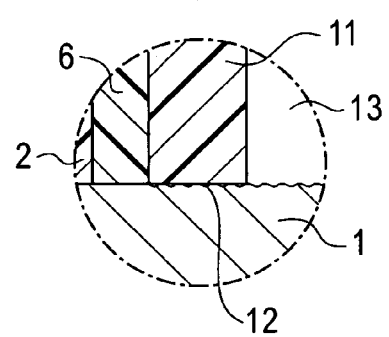
Figure 4F:
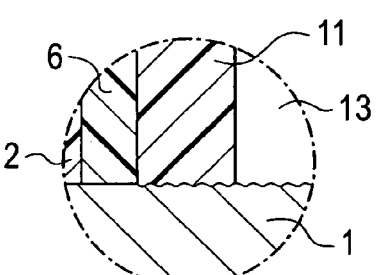

Then the second pure water dipping processing (i.e., Step 2b of Embodiment 2) is performed so that the HF aqueous solution 15 is substituted with the pure water 12, as FIG. 4C shows. Then the semiconductor device is placed in a high temperature chamber, so as to perform drying processing in high temperature air 13. By this drying processing, the water 12 which has entered between the silicon substrate 1 and resist 11 is evaporated. Because of the surface tension generated upon the evaporation of the water 12, the resist 11 is attracted toward the silicon substrate 1, and the resist 11 is adhered to the silicon substrate 1, as FIG. 4D to FIG. 4F. The resist 11 enters (engages with or bites) the bumps on the surface of the silicon substrate 1, so that strong adhesion is obtained.

As described above, according to the semiconductor device fabrication method of Embodiment 3, a short period of etchant dipping processing is performed on the semiconductor device, after the surface active agent dipping processing. By this etchant dipping, the silicon substrate 1 has small concave and convex in the surface, while the natural oxide film is removed. Therefore the silicon substrate 1 and resist 11 can be strongly adhered by the subsequent pure water dipping processing and drying processing. Accordingly, problems with the HF cleaning processing can be prevented.

The present invention is not limited to the above described embodiments, and various modifications and changes can be made. For example:

(a) The semiconductor device is the acceleration sensor in the illustrated embodiments, but the present invention can be applied to semiconductor devices in general, such as integrated circuits including an ordinary LSI.

(b) In the pure water dipping processing, the semiconductor device is dipped into the still pure water 12, but may be dipped in running water.

(c) The semiconductor device in the pure water bath may be cleaned with ultrasonic by applying ultrasonic waves to the pure water 12.

This application is based on Japanese Patent Application No. 2005-284286 filed on Sep. 29, 2005 and the entire disclosure thereof is incorporated herein by reference.

What is claimed is:

1. A semiconductor device fabrication method comprising:
   preparing a semiconductor substrate on which a circuit element and a protective film for protecting said circuit element are formed;
   forming a resist that covers said protective film;
   dipping the semiconductor substrate, on which said resist covering said protective film is formed, into pure water so as to allow water to filter into a gap between said resist and said semiconductor substrate; and
   drying said semiconductor substrate, on which said resist covering said protective film is formed, at high temperature so as to evaporate the water which has filtered into the gap between said resist and said semiconductor substrate, the drying drawing said resist toward said semiconductor substrate, thereby adhering said resist to said semiconductor substrate.

2. The semiconductor device fabrication method according to claim 1, further comprising cleaning said semiconductor device after said drying the semiconductor substrate.

3. The semiconductor device fabrication method according to claim 1, wherein said dipping the semiconductor substrate includes:
   a first pure water dipping processing for dipping the semiconductor substrate, on which said resist covering said protective film is formed, into pure water so as to allow water to filter into the gap between said resist and said semiconductor substrate;
   a surface active agent dipping processing for dipping the semiconductor substrate, on which said resist covering said protective film is formed, into surface active agent so as to substitute said water with said surface active agent; and
   a second pure water dipping processing for dipping the semiconductor substrate, on which said resist covering said protective film is formed, into pure water so as to substitute said surface active agent with said pure water.

4. The semiconductor device fabrication method according to claim 1, wherein said dipping the semiconductor substrate includes:
- a first pure water dipping processing for dipping the semiconductor substrate, on which said resist covering said protective film is formed, into pure water so as to allow water to filter into the gap between said resist and said semiconductor substrate,
- a surface active agent dipping processing for dipping the semiconductor substrate, on which said resist covering said protective film is formed, into surface active agent so as to substitute said water with said surface active agent,
- an etchant dipping processing for dipping the semiconductor substrate, on which said resist covering said protective film is formed, into etchant so as to substitute said surface active agent with said etchant and roughen the surface of said semiconductor substrate; and
- a second pure water dipping processing for dipping the semiconductor substrate, on which said resist covering said protective film is formed, into pure water so as to substitute said etchant with said pure water.

5. The semiconductor device fabrication method according to claim 4, wherein said etchant is hydrogen fluoride aqueous solution.

6. The semiconductor device fabrication method according to claim 1, wherein said pure water is running pure water.

7. The semiconductor device fabrication method according to claim 1, wherein said pure water is ultrasonic vibration-applied pure water.

8. The semiconductor device fabrication method according to claim 1, wherein said semiconductor device is an acceleration sensor that has an outer frame section, a weight section and at least one flexible beam section for connecting said weight section to said outer frame section, and the outer frame section, weight section and at least one flexible beam section are integrated by processing the silicon substrate.

9. The semiconductor device fabrication method according to claim 1, wherein said pure water is still pure water.

10. The semiconductor device fabrication method according to claim 1, wherein said high temperature is between about 130 degrees C. and about 150 degrees C.

11. The semiconductor device fabrication method according to claim 2, wherein said cleaning is performed with a hydrogen fluoride aqueous solution.

12. The semiconductor device fabrication method according to claim 4, wherein said etchant dipping processing is performed with a 5% hydrogen fluoride aqueous solution for a predetermined period.

13. The semiconductor device fabrication method according to claim 4, wherein said etchant dipping processing removes a natural oxide from the surface of the semiconductor substrate.

14. The semiconductor device fabrication method according to claim 12, wherein said predetermined period is about two minutes.

15. A semiconductor device fabrication method comprising:
- preparing a semiconductor substrate on which a circuit element and a protective film for protecting said circuit element are formed;
- forming a resist that covers said protective film;
- dipping the semiconductor substrate, on which said resist covering said protective film is formed, into pure water so as to allow water to filter into a gap between said resist and said semiconductor substrate;
- drying said semiconductor substrate, on which said resist covering said protective film is formed, at high temperature so as to evaporate the water which has filtered into the gap between said resist and said semiconductor substrate, the drying drawing said resist toward said semiconductor substrate, thereby adhering said resist to said semiconductor substrate; and
- allowing said resist to adhere to said semiconductor substrate upon said evaporation of the water during the drying.

16. The semiconductor device fabrication method according to claim 15, wherein said resist is drawn toward said semiconductor substrate by surface tension of the water evaporating in the gap.

* * * * *